United States Patent
Kim et al.

(10) Patent No.: US 7,005,748 B2
(45) Date of Patent: Feb. 28, 2006

(54) FLIP CHIP INTERFACE CIRCUIT OF A SEMICONDUCTOR MEMORY DEVICE

(75) Inventors: Du-Eung Kim, Yongin (KR); Beak-Hyung Cho, Osan (KR)

(73) Assignee: Samsung Electronics Co., Ltd., Suwon (KR)

( * ) Notice: Subject to any disclaimer, the term of this patent is extended or adjusted under 35 U.S.C. 154(b) by 79 days.

(21) Appl. No.: 10/435,024

(22) Filed: May 12, 2003

(65) Prior Publication Data

US 2003/0211679 A1 Nov. 13, 2003

(30) Foreign Application Priority Data

May 10, 2002 (KR) ................................ 2002-25900

(51) Int. Cl.
*H01L 23/48* (2006.01)
*H01L 23/52* (2006.01)
*H01L 29/40* (2006.01)

(52) U.S. Cl. ...................... 257/778; 257/666; 257/678; 257/723; 438/106; 438/108; 438/123

(58) Field of Classification Search ................ 257/666, 257/686, 778, 723, 678; 438/108, 109, 128, 438/455, 106, 121, 123
See application file for complete search history.

(56) References Cited

U.S. PATENT DOCUMENTS

| | | | | |
|---|---|---|---|---|
| 5,633,833 A | * | 5/1997 | Yoon | 365/230.08 |
| 5,701,031 A | * | 12/1997 | Oguchi et al. | 257/686 |
| 5,744,827 A | | 4/1998 | Jeong et al. | 257/686 |
| 5,757,080 A | * | 5/1998 | Sota | 257/777 |
| 5,880,531 A | * | 3/1999 | Hagiya et al. | 257/786 |
| 6,317,377 B1 | * | 11/2001 | Kobayashi | 365/220 |
| 6,430,717 B1 | * | 8/2002 | Noji | 714/718 |
| 6,566,760 B1 | * | 5/2003 | Kawamura et al. | 257/777 |
| 6,593,646 B1 | * | 7/2003 | Callahan | 257/686 |
| 2002/0000672 A1 | * | 1/2002 | Mori | 257/777 |
| 2003/0075789 A1 | * | 4/2003 | Kawamura et al. | 257/678 |

\* cited by examiner

*Primary Examiner*—Amir Zarabian
*Assistant Examiner*—Thanh Y. Tran
(74) *Attorney, Agent, or Firm*—Lee & Morse, P.C.

(57) ABSTRACT

A flip chip interface circuit for combining two identical semiconductor chips on upper and lower surfaces of an assembling lead frame into one flip chip package includes at least first and second address pads and first and second bonding option pads formed symmetrically on the chips in a mirror type arrangement to each other. The first and second address pads are input with a signal for selecting operations of the first and second semiconductor chips. The first and second input pad selection and chip selection signals are output in response to signals from the first and second address pads and first and second bonding option pads of the chips, the first and second semiconductor chip selection signals are output in response to the first and second input pad and chip selection signals, and an interface enable signal is output in response to the first and second semiconductor chip selection signals.

17 Claims, 5 Drawing Sheets

FLIP CHIP INTERFACE CIRCUIT OF A SEMICONDUCTOR MEMORY DEVICE

BACKGROUND OF THE INVENTION

1. Field of the Invention

The present invention relates to a flip chip interface circuit of a semiconductor memory device and a method thereof. More particularly, the present invention relates to a circuit and a method for determining an interface with bonding option data when two chips of a semiconductor memory device are combined in a mirror type arrangement and packaged into a flip chip.

2. Description of the Related Art

Generally, a semiconductor package is made by forming signal input/output terminals in a main board and mounting semiconductor chip packages thereto, such that single devices and integrated circuits, etc., that are formed by depositing various electronic circuits and wires on a substrate may be protected from various external environments such as dust, moisture, electrical and mechanical loads, and such that the performance of the semiconductor chip may be optimized. As semiconductor chips become more highly integrated, having higher performance, higher functions, and a higher degree of miniaturization, semiconductor packages accordingly require multiple pins and greater miniaturization techniques to reduce the size and weight of the packages. Accordingly, a ball grid array (BGA) package that uses solder balls as input/output terminals has been developed. However, because bonding wires are used for connecting the semiconductor chips to the package, and because the size of the package is increased due to loops in the bonding wires, the density of the package and the design margin of electrical patterns on a circuit board, such as a motherboard, are limited.

To eliminate the wire bonding loops, a flip chip technique has been developed. A typical flip chip is a semiconductor chip in which a bump made of a soft metal, such as solder, gold (Au), lead (Pb), or silver (Ag), is formed on each input/output pad on the surface of the semiconductor chip. The chip is mounted by bonding the chip with the bumps facedown on a printed circuit board or a main board without using wires. In the sense that the semiconductor chip is turned over when bonded on a circuit board, it is called a flip chip.

A flip chip bonding technique requires forming a bump on an integrated circuit of a semiconductor chip and connecting the chip to a substrate by using the bump. In the flip chip bonding technique, the bump may be simultaneously connected to the integrated circuit when providing the substrate with the semiconductor chip, and the electrical paths formed therein are short. Therefore, a flip chip bonding technique is frequently used in manufacturing electronic products requiring a light weight, a high degree of miniaturization, and a high level of density, and is frequently applied to fabrication of semiconductor chip packages such as ball grid array (BGA) packages and chip scale packages (or chip size packages).

FIG. 1 illustrates a cross sectional view of a flip chip package in which two identical chips are bonded facedown. The flip chip package includes a first semiconductor chip 10, a second semiconductor chip 12 that is identical to the first semiconductor chip 10, and an assembling lead frame 14 that is provided between the first and second semiconductor chips 10 and 12, respectively. The first and second semiconductor chips 10 and 12 each have first to sixth pads #1, #2, #3, #4, #5, #6. The lead frame 14 has first to sixth landing pads P1, P2, P3, P4, P5, P6, which correspond to and are aligned with the first to sixth pads #1, #2, #3, #4, #5, #6 of the first and second semiconductor chips 10 and 12, respectively. The first to sixth pads #1, #2, #3, #4, #5, #6 of the first semiconductor chip 10 and the sixth to first pads #6, #5, #4, #3, #2, #1 of the second semiconductor chip 12 are in a mirror type connection to the first to sixth landing pads P1, P2, P3, P4, P5, P6. The first semiconductor chip 10 will be referred to as the TOP chip and the second semiconductor chip 12 as the BOT chip for the following discussion of FIG. 2, which illustrates a perspective view of the flip chip pad illustrates in FIG. 1.

Referring to FIG. 2, the first to sixth pads of the second semiconductor chip 12 that are positioned below the assembling lead frame 14 are arranged in the order of #1, #2, #3, #4, #5, #6 from right to left. The first to sixth pads of the first semiconductor chip 10 that are placed above the assembling lead frame 14 are arranged in the order of #1, #2, #3, #4, #5, #6 from left to right. Thus, the pads of the first semiconductor chip 10 and the second semiconductor chip 12 are connected to one another through the landing pads P1, P2, P3, P4, P5, P6. That is, the first landing pad P1 is connected between the first pad #1 of the first semiconductor chip 10 and the sixth pad #6 of the second semiconductor chip 12, the second landing pad P2 is connected between the second pad #2 of the first semiconductor chip 10 and the fifth pad #5 of the second semiconductor chip 12, etc.

When two identical chips are assembled as described above, information about a chip to be arranged on top of an assembling lead frame and a chip to be arranged on a bottom of the assembling lead frame should be given to a chip and the interface should be controlled accordingly. Thus, techniques for preventing interface conflicts are required.

SUMMARY OF THE INVENTION

It is a feature of an embodiment of the present invention to provide a flip chip interface circuit for a semiconductor memory device and a method for determining interface characteristics for bonding when two identical chips are combined in one semiconductor chip package, thereby preventing interface conflicts.

It is another feature of an embodiment of the present invention to provide a flip chip interface circuit and method for determining interface characteristics in response to the bonding of Vcc (supply voltage) and Vss (ground) to a top chip and a bottom chip when two identical chips are combined and used as one semiconductor chip package.

In a preferred embodiment of the present invention, a flip chip interface circuit of a semiconductor memory device for combining a first semiconductor chip and a second semiconductor chip which are identical to each other into one flip chip package includes a chip selection circuit for outputting first and second input pad selection signals and a chip select signal in response to signals input from first and second address pads and first and second bonding option pads that are provided in each of the two identical chips, and a control circuit for outputting first and second semiconductor chip selection signals in response to an input of the chip select signal and an input pad selection signal output from the chip selection circuit, and for controlling input/output of the first semiconductor chip and the second semiconductor chip. The chip selection circuit preferably further includes an input pad selector for receiving a signal input from the first bonding option pad and the second bonding option pad to output first and second input pad selection signals; and a chip selector for performing a logic operation on the first and second input pad selection signals output from the input pad selector and signals input from the first and second address pad to output a chip selection signal.

The input pad selector preferably includes a first inverter for inverting data of the first bonding option pad in response to bonding data of the second bonding option pad; a second inverter for inverting data of the second bonding option pad in response to bonding data of the first bonding option pad; a first input pad selector for outputting the first input pad selection signal when the bonding data of the first bonding option pad is at an active state; and a second input pad selector for outputting the second input pad selection signal when the bonding data of the second bonding option pad is at an active state.

The first inverter may be an NMOS transistor, and the second inverter may be an NMOS transistor. The first input pad selector may consist of two or three inverters connected in series. The first and second address pads are preferably input with additional addresses and select an active mode or a standby mode of the first and second semiconductor chips in response to an input voltage of the additional addresses.

In a flip chip interface circuit of a semiconductor memory device for interfacing with a flip chip package, the flip chip package having a first semiconductor chip provided on an upper side of an assembling lead frame having first and second address pads, first and second bonding option pads, and various pads formed thereon, and a second semiconductor chip provided under the assembling lead frame wherein the first and second address pads, first and second bonding option pads, and various pads that are formed on the first semiconductor chip are also symmetrically arranged on the second semiconductor chip in a mirror type arrangement relative to the first semiconductor chip, wherein the first and second address pads are input with a signal for selecting operations of the first and second semiconductor chips, the first bonding option pad of the first semiconductor chip is connected to Vcc, the second bonding option pad of the first semiconductor chip is not connected to ground nor electrically connected, the second bonding option pad of the second semiconductor chip is connected to Vcc, and the first bonding option pad of the second semiconductor chip is not connected to ground nor electrically connected, the flip chip interface circuit including a chip selection circuit for outputting first and second input pad selection signals and first and second semiconductor chip selection signals in response to signals input from the first and second address pads and the first and second bonding option pads; a control circuit for controlling input/output of the first and second semiconductor chips in response to inputs of the first and second semiconductor chip selection signals and the first and second input pad selection signals output from the chip selection circuit; and an input circuit for transmitting data input from a plurality of pads formed in the first and second semiconductor chips to the first and second semiconductor chips in response to first and second semiconductor chip selection input control signals of the control circuit.

Further, the first and second address pads may be input with additional addresses and select an active mode or a standby mode of the first and second semiconductor chips in response to an input voltage of the additional addresses.

The chip selection circuit preferably includes an input pad selector for receiving a signal input from the first bonding option pad and the second bonding option pad to output first and second input pad selection signals and a chip selector for performing a logic operation on the first and second input pad selection signals output from the input pad selector and signals input from the first and second address pads to output a chip selection signal.

The input pad selector preferably includes a first inverter for inverting data of the first bonding option pad in response to bonding data of the second bonding option pad, a second inverter for inverting data of the second bonding option pad in response to bonding data of the first bonding option pad, a first input pad selector for outputting a first input pad selection signal when the bonding data of the first bonding option pad is at an active state, and a second input pad selector for outputting a second input pad selection signal when the bonding data of the second bonding option pad is at an active state.

The first inverter may be an NMOS transistor, and the second inverter may be an NMOS transistor. The first input pad selector may consist of two or three inverters connected in series. Further, the chip selection circuit preferably includes a first NMOS transistor having a grounded source, a drain connected to the first bonding option pad and a gate connected to the second bonding option pad, a second NMOS transistor having a grounded source, a drain connected to the second bonding option pad and a gate connected to the first bonding option pad; and first, second and third inverters connected in series to the first bonding option pad, wherein an output terminal of the second inverter outputs a first input pad selection signal and a an output terminal of the third inverter outputs a second input pad selection signal.

In an embodiment of the present invention, a flip chip interface method is provided in a semiconductor memory device having a packaged flip chip in which the packaged flip chip includes a first semiconductor chip provided on an upper surface of an assembling lead frame in a flip chip package in which two identical chips are bonded, the first semiconductor device having first and second address pads, first and second bonding option pads, and various pads formed thereon; a second semiconductor chip provided under the assembling lead frame having at least first and second address pads and first and second bonding option pads, wherein the first and second address pads and first and second bonding option pads formed on the first semiconductor chip are also symmetrically formed on the second semiconductor chip in a mirror type arrangement to the first semiconductor chip, the first and second address pads are input with a signal for selecting operations of the first and second semiconductor chips, the first bonding option pad of the first semiconductor chip is connected to Vcc, the second bonding option pad of the first semiconductor chip is not connected to ground nor electrically connected, the second bonding option pad of the second semiconductor chip is connected to Vcc, and the first bonding option pad of the second semiconductor chip is not connected to ground nor electrically connected, the flip chip interface method includes outputting the first and second input pad selection signals and the chip selection signals in response to signals input from the first and second address pads and the first and second bonding option pads of the first and second semiconductor chips, outputting the first and second semiconductor chip selection signals by using the first and second input pad selection signals and the chip selection signals, and outputting an interface enable signal for controlling data input/output of the first and second semiconductor chips in response to the first and second semiconductor chip selection signals.

BRIEF DESCRIPTION OF THE DRAWINGS

These and other features and advantages of the present invention will be readily apparent to those of ordinary skill in the art upon review of the detailed description of preferred embodiments thereof with reference to the attached drawings in which.

DETAILED DESCRIPTION OF THE INVENTION

Figure 1:
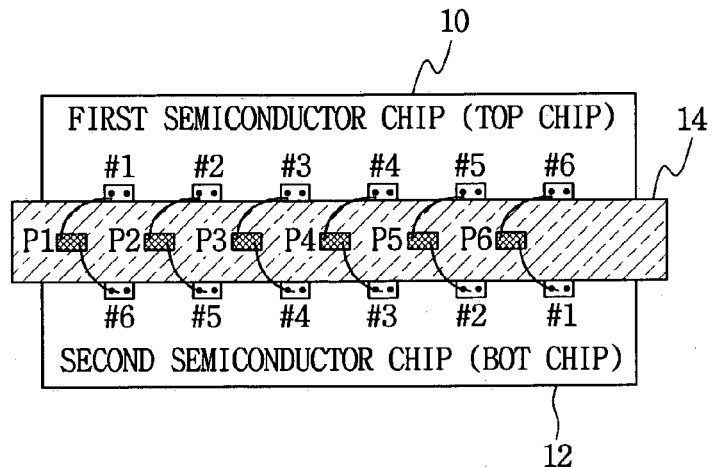
FIG. 1 illustrates a cross sectional view of a flip chip package which is formed by facedown bonding two identical chips.
Figure 2:
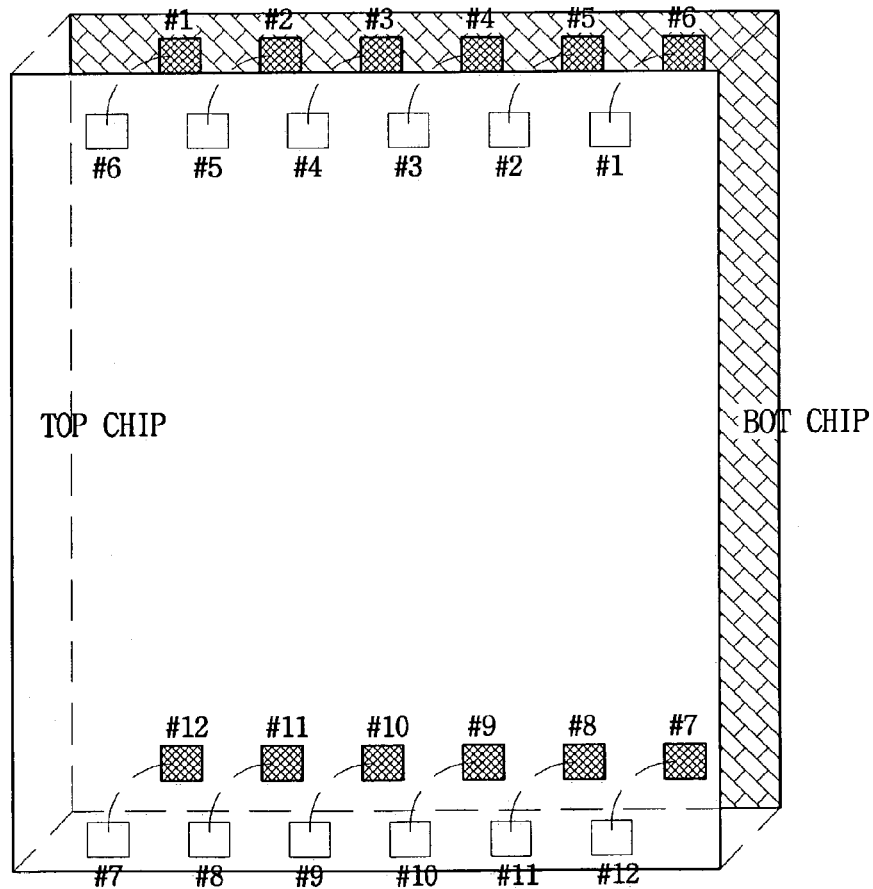
FIG. 2 illustrates a perspective view of a flip chip pad of FIG. 1.

Korean Patent Application No. 2002-25900, filed on May 10, 2002, and entitled, "Flip Chip Interface Circuit of Semiconductor Memory Device and Method for Interfacing Flip Chip" is incorporated by reference herein in its entirety.

Preferred embodiments of the present invention will now be described in detail with reference to the accompanying drawings, in which like reference numerals and symbols are used to denote like or equivalent parts or portions. For simplicity of illustration and explanation, detailed descriptions of known features and functions will be omitted.

Figure 3:
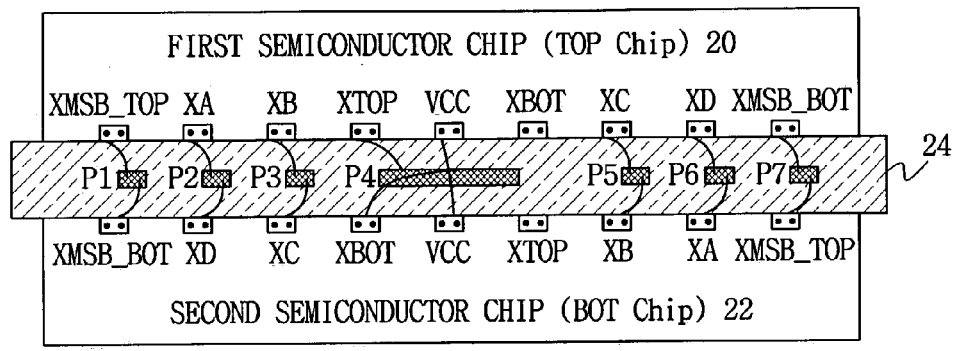
FIG. 3 illustrates a cross sectional view of a flip chip package in which a bonding option pad bonding technique is applied in accordance with an embodiment of the present invention.

FIG. 3 illustrates a cross sectional view of a flip chip package in which a bonding option pad bonding technique of the present invention is applied. An assembling lead frame 24 is preferably arranged between a first semiconductor chip TOP Chip 20 and a second semiconductor chip BOT Chip 22 which is identical to the first semiconductor chip TOP Chip 20.

The first semiconductor chip 20 is provided therein with a first address pad XMSB_TOP, pads XA, XB, a first bonding option pad XTOP, a pad Vcc, a second bonding option pad XBOT, pads XC, XD, a second address pad XMSB_BOT, in due order from left to right. The second semiconductor chip 22 is arranged therein with a first address pad XMSB_TOP, pads XA, XB, a first bonding option pad XTOP, a pad Vcc, a second bonding option pad XBOT, pads XC, XD, a second address pad XMSB_BOT, in due order from right to left. The pads of the semiconductor chip 20 and the semiconductor chip 22 are arranged in a mirrored arrangement wherein the pads face each other.

A first pad P1 of the assembling lead frame 24 is bonded to the first address pad XMSB of the first semiconductor chip 20. A second pad P2 of the assembling lead frame 24 is bonded to the pad XA of the first semiconductor chip 20. A third pad P3 of the assembling lead frame 24 is bonded to the pad XB of the first semiconductor chip 20. A fourth pad P4 of the assembling lead frame 24 is bonded to the first bonding option pad XTOP and the pad Vcc of the first semiconductor chip 20. The second bonding option pad XBOT of the first semiconductor chip 20 is bonded to Vss or not bonded to Vss thereby not being connected electrically. A fifth pad P5 of the assembling lead frame 24 is bonded to the pad XC of the first semiconductor chip 20. A sixth pad P6 of the assembling lead frame 24 is bonded to the pad XD of the first semiconductor chip 20. A seventh pad P7 of the assembling lead frame 24 is bonded to the second address pad XMSB_BOT of the first semiconductor chip 20.

The first pad P1 of the assembling lead frame 24 is bonded to the second address pad XMSB_BOT of the second semiconductor chip 22. The second pad P2 of the assembling lead frame 24 is bonded to the pad XD of the first semiconductor chip 22. The third pad P3 of the assembling lead frame 24 is bonded to the pad XC of the second semiconductor chip 22. The fourth pad P4 of the assembling lead frame 24 is bonded to the second bonding option pad XBOT and the pad Vcc of the second semiconductor chip 22. The first bonding option pad XTOP of the second semiconductor chip 22 is bonded to Vss or not bonded to Vss thereby not being connected electrically. The fifth pad P5 of the assembling lead frame 24 is bonded to the pad XB of the second semiconductor chip 22. The sixth pad P6 of the assembling lead frame 24 is bonded to the pad XA of the second semiconductor chip 22. The seventh pad P7 of the assembling lead frame 24 is bonded to the first address pad XMSB_TOP of the second semiconductor chip 22.

Figure 4:
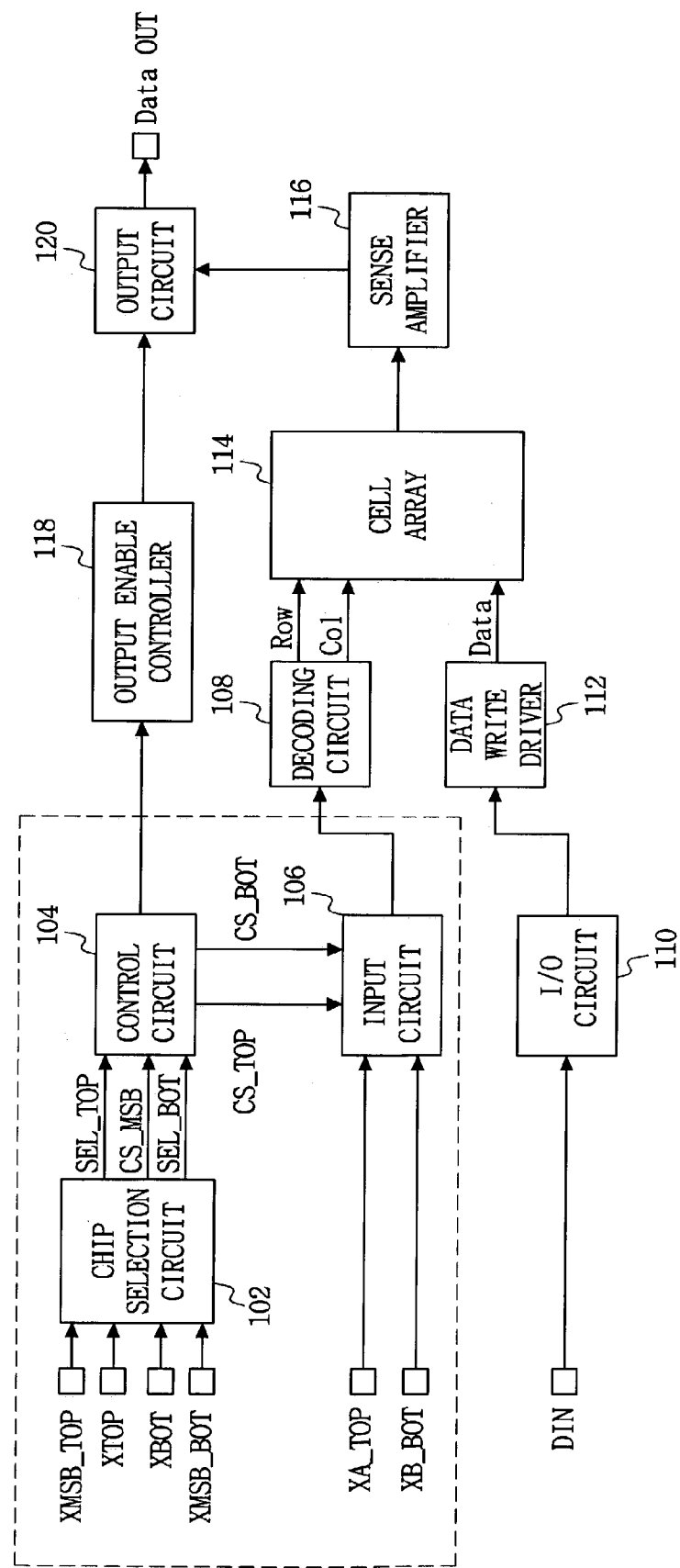
FIG. 4 illustrates a block diagram of a semiconductor memory device for illustrating an interface in accordance with the bonding option pad of the present invention.

FIG. 4 illustrates a block diagram of a semiconductor memory device for determining an interface according to a bonding option pad according to the present invention.

The semiconductor device preferably includes a chip selection circuit 102; a control circuit 104; an input circuit 106; a decoding circuit 108; an input/output buffer I/O circuit 110; a data writing driver 112; a cell array 114; a sense amplifier 116; an output enable controller 118; and an output circuit 120. The chip selection circuit 102 is connected to first and second address pads XMSB_TOP, XMSB_BOT and first and second bonding option pads XTOP, XBOT to output first and second input pad selection signals SEL_TOP, SEL_BOT and a chip selection signal CS_MSB. The first and second input pad selection signals SEL_TOP, SEL_BOT and the chip selection signal CS_MSB, which are generated in response to signals input from the first and second address pads XMSB_TOP, XMSB_BOT and the first and second bonding option pads XTOP, XBOT are received in control circuit 104 and control an input/output of the first semiconductor chip 20 (not shown) and the second semiconductor chip 22 (not shown).

Input circuit 106 inputs control signals and data through a plurality of pads from the first semiconductor chip 20 or the second semiconductor chip 22, such as XA-TOP and XB-BOT. Decoding circuit 108 generates an address data in response to a control data input from the input circuit 106. The I/O circuit 110 receives, buffers, and outputs data input from the pads of first and second semiconductor chips 20 and 22, respectively. The data writing driver 112 receives data from the I/O buffer 110 and writes it to cell array 114, in conjunction with the address generated from the decoding circuit 108. The sense amplifier 116 senses the data stored in the cell array 114 and the output circuit 120 outputs that data in response to a "data output enable" signal from the output enable controller 118 and the control circuit 104.

Figure 5:
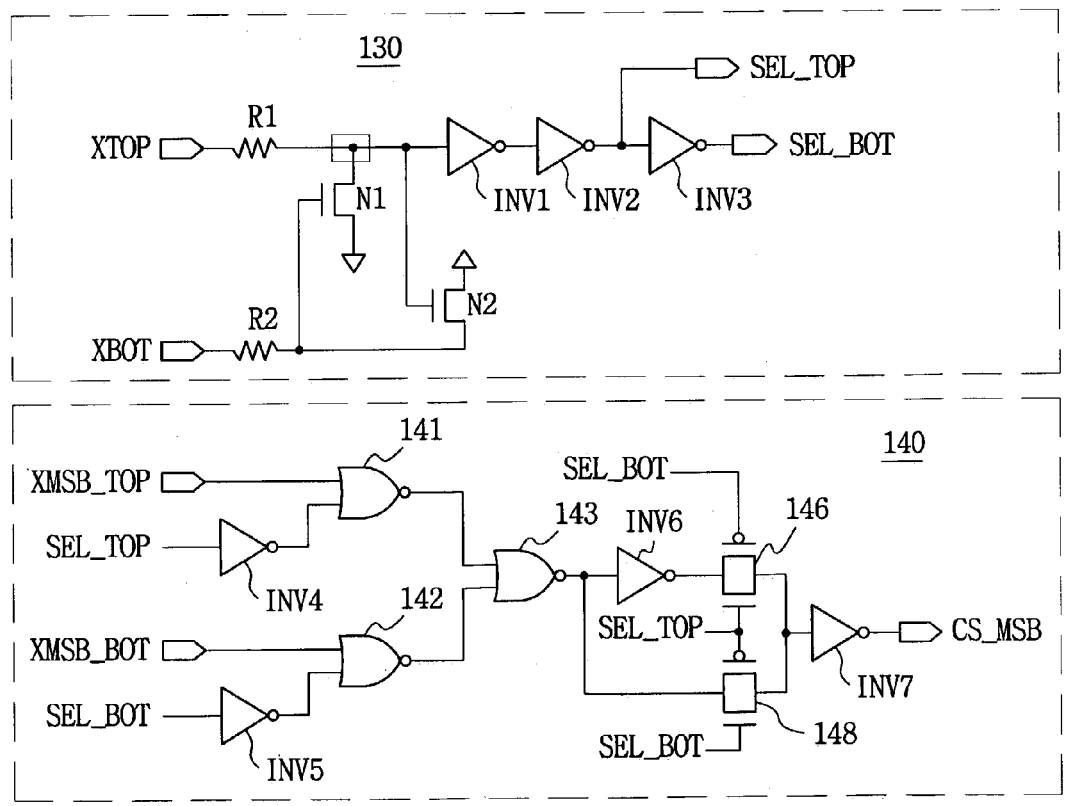
FIG. 5 illustrates a detailed circuit diagram of a chip selection circuit shown in FIG. 4 in accordance with an embodiment of the present invention.

FIG. 5 illustrates a detailed circuit diagram of the chip selection circuit 102 of FIG. 4. The chip selection circuit 102 preferably includes an input pad selector 130 and a chip selector 140. The input pad selector 130 receives a signal input from the first bonding option pad XTOP and the second bonding option pad XBOT and outputs the first and second input pad selection signals SEL_TOP, SEL_BOT, respectively. The chip selector 140 performs a logic operation on the first and second input pad selection signals SEL_TOP, SEL_BOT output from the input pad selector 130 and signals input from the first and second address pads XMSB_TOP, XMSB_BOT to output the first and second semiconductor chip selection signals CS_MSB.

In the input pad selector 130, a resistance R1 is connected between the first bonding option pad XTOP and a drain of NMOS transistor N1. A resistance R2 is connected between the second bonding option pad XBOT and a gate of the NMOS transistor N1, and a source of the NMOS transistor N1 is grounded. A drain of NMOS transistor N2 is connected to a connection node of the resistance R2 and the gate of the NMOS transistor N1. The drain of the NMOS transistor N1 is connected to a gate of the NMOS transistor N2, and a source of the NMOS transistor N2 is grounded. The drain of the NMOS transistor N1 is connected in series to three inverters INV1, INV2, INV3, where an output terminal of the inverter INV2 is connected to SEL_TOP and an input terminal of the inverter INV3 is connected to SEL_BOT.

In the chip selector 140 an inverter INV4 is connected to an output terminal of the inverter INV2 of the input pad selector 130 to invert the first input selection signal SEL_TOP. A NOR gate 141 inverts and ORs (NORs) a signal of the first address pad XMSB_TOP with an output signal of the inverter INV4. An inverter INV5 connected to an output terminal of the inverter INV3 of the input pad selector 130 inverts the second option pad selection signal SEL_BOT. A NOR gate 142 NORs an output signal of the inverter INV5 with a signal of the address pad XMSB_BOT. A NOR gate 143 NORs an output signal of the NOR gates 141,142. An inverter INV6 inverts an output signal of the NOR gate 143. A first transmission gate 146 inputs the first and second input pad selection signals SEL_TOP, SEL_BOT output from the inverter INV3 of the input pad selector 130 at its gate, to output a signal output from the inverter INV6. A second transmission gate 148 inputs the first and second input pad selection signals SEL_TOP, SEL_BOT output from the inverters INV2, INV3 of the input pad selector 130 at its gate, to output a signal output from the NOR gate 143. An inverter INV7 inverts a signal output from the first and second transmission gates 146,148 to output a chip selection signal CS_MSB.

Figure 6:
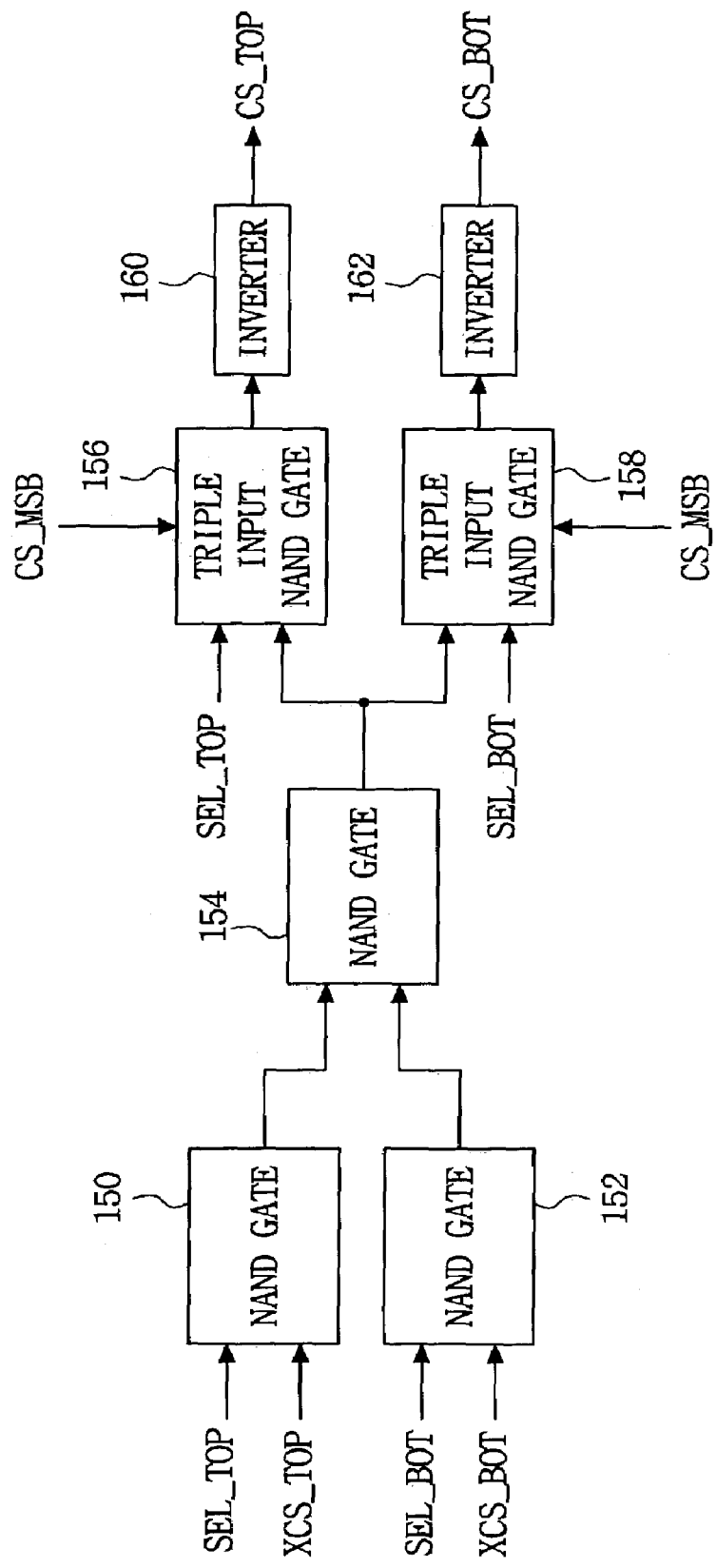
FIG. 6 illustrates a detailed circuit diagram of a control circuit shown in FIG. 4.

FIG. 6 illustrates a detailed diagram of the control circuit 104 shown in FIG. 4.

The control circuit 104 preferably includes a NAND gate 150 for NANDing and outputting a chip enable signal XCS_TOP of the first semiconductor chip 20 and the first input pad selection signal SEL_TOP output from the inverter INV2 of the input pad selector 130 of FIG. 5; a NAND gate 152 for NANDing and outputting a chip enable signal XCS_BOT of the second semiconductor chip 22 and the second input pad selection signal SEL_BOT output from the inverter INV3 of the input pad selector 130 of FIG. 5; a NAND gate 154 for NANDing and outputting an output signal of the NAND gates 150, 152; a triple-input NAND gate 156 for NAN Ding and outputting the first input pad selection signal SEL_TOP output from the inverter INV2 of the input pad selector 130 of FIG. 5, a signal output from the NAND gate 154, and the chip selection signal CS_MSB output from the inverter INV7 of the chip selector 140 of FIG. 5; a triple-input NAND gate 158 for NANDing and outputting the second input pad selection signal SEL_BOT output from the inverter INV3 of the input pad selector 130 of FIG. 5, a signal output from the NAND gate 154, and the chip selection signal CS_MSB output from the inverter INV7 of the chip selector 140 of FIG. 5; an inverter 160 for inverting a signal output from the triple-input NAND gate 156 to output the first semiconductor chip selection signal CS_TOP; and an inverter 162 for inverting a signal output from the triple-input NAND gate 158 to output the second semiconductor chip selection signal CS_BOT.

Figure 7:
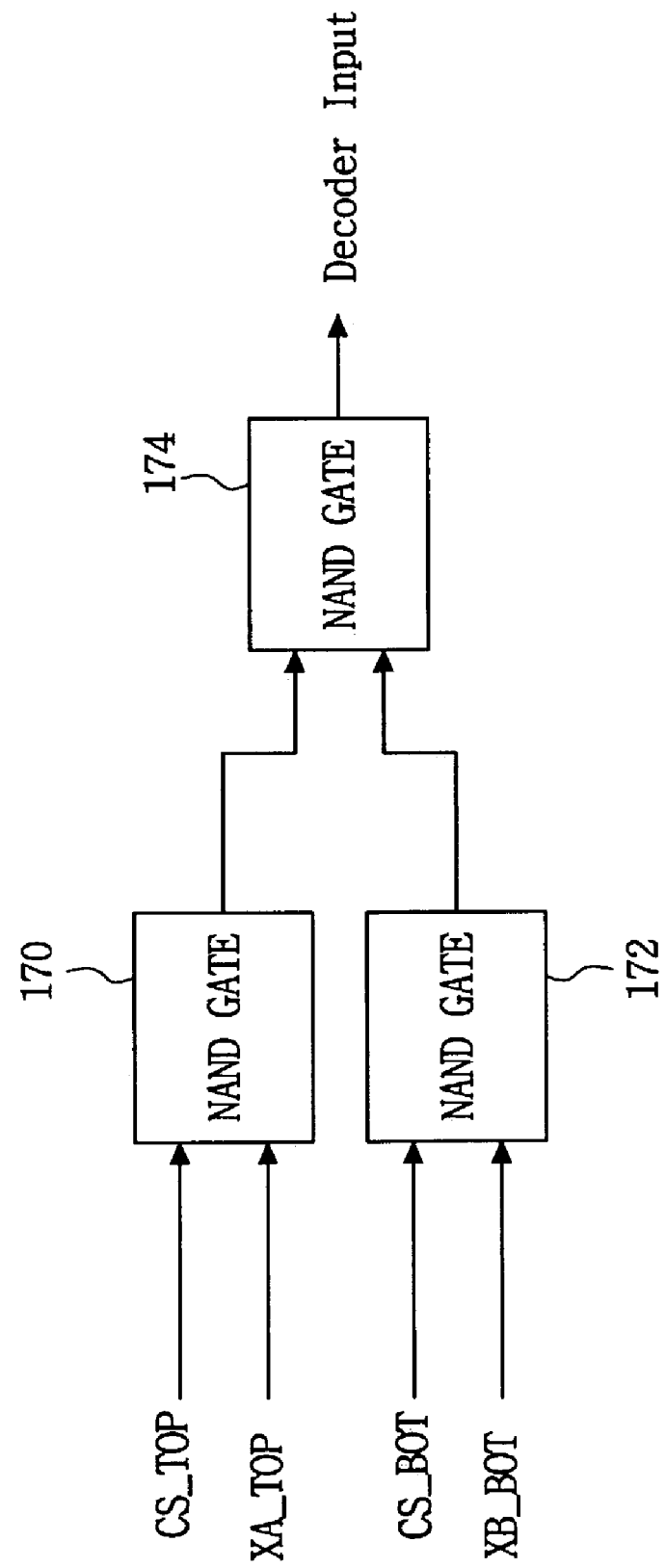
FIG. 7 illustrates a detailed block diagram of an input circuit shown in FIG. 4.

FIG. 7 illustrates a detailed diagram of the input circuit 106 shown in FIG. 4.

The input circuit 106 preferably includes a NAND gate 170 for NANDing and outputting the first semiconductor chip selection signal CS_TOP with an input signal XA_TOP from pad XA of the first semiconductor chip 20; a NAND gate 172 for NANDing and outputting the second semiconductor chip selection signal CS_BOT output from the inverter 162 of FIG. 6 and an input signal XB_BOT from pad XB of the second semiconductor chip 22; and a NAND gate 174 for NANDing an output signal of the NAND gates 170, 172 to output a decoder enable signal.

An operation according to embodiments of the present invention will be explained below with reference to FIGS. 3 through 7.

Referring to FIG. 3, the first semiconductor chip 20, the first bonding option pad XTOP is bonded to Vcc and the second bonding option pad XBOT is not bonded nor electrically connected to Vss (ground). In the second semiconductor chip 22, the second bonding option pad XBOT is bonded to Vcc and the first bonding option pad XTOP is not bonded nor electrically connected to Vss (ground).

Accordingly, in the first semiconductor chip 20, when a high level signal is input to the first bonding option pad XTOP, interface circuits relating to the first semiconductor chip 20 are enabled and interface circuits relating to the second semiconductor chip 22 are disabled. In the second semiconductor chip 22, when a high level signal is input to the second bonding option pad XBOT, interface circuits relating to the second semiconductor chip 22 are enabled and interface circuits relating to the first semiconductor chip 20 are disabled. At this time, when the first address pad XMSB_TOP of the first semiconductor chip 20 is input with a high level signal, the second address pad XMSB_BOT is input with a low level signal, and the first semiconductor chip 20 becomes activated, while the second semiconductor chip 22 enters a standby state. When the first address pad XMSB_TOP of the second semiconductor chip 22 is input with a low level signal, and the second address pad XMSB_BOT is input with a high level signal, the second semiconductor chip 22 becomes activated, while the first semiconductor chip 20 enters a standby state.

An operation for determining the interface method of the present invention will now be explained with reference to FIGS. 3 and 4.

To operate the first semiconductor chip 20 of FIG. 3, a high level signal is input to the first address pad XMSB_TOP and a high level signal is input to the second address pad XMSB_BOT. The first bonding option pad XTOP of the first semiconductor chip 20 is connected to Vcc and the second bonding option pad XBOT is not bonded nor electrically connected to Vss. At this time, the first chip selection circuit 102 receives a high level signal from the first bonding option pad XTOP, a first semiconductor chip enable signal and a second semiconductor chip disable signal from the first address pad XMSB_TOP, and outputs the signals to the control circuit 104. The first and second address pads XMSB_TOP, XMSB_BOT are assigned with additional addresses when the second semiconductor chip 22 and the first semiconductor chip 20 are both packaged into a flip chip, and selection of active or standby modes of the first and second semiconductor chips 20, 22, respectively, is based on a voltage level of the highest bit of the additional addresses.

Operation of the chip selection circuit 102 of the present invention will be explained below with reference to FIG. 5.

When the first address pad XMSB_TOP is input with a high level signal and the second address pad XMSB_BOT is input with a high level signal, the first bonding option pad XTOP of the first semiconductor chip 20 is connected to Vcc and the second bonding option pad XBOT remains floating. Accordingly, the first bonding option pad XTOP of the first semiconductor chip 20 is input with a high level signal and the second bonding option pad XBOT is input with a low level signal, or no signal, and the NMOS transistor N1 is turned off and the NMOS transistor N2 is turned on. When the NMOS transistor N2 is turned on, the second bonding option pad XBOT is connected to a ground terminal and enters a low level state, and a high level signal at the drain terminal of the NMOS transistor N1 serves to output the first input pad selection signal SEL_TOP as a high level signal through the inverters INV1, INV2. The high level signal transmitted through the inverters INV1, INV2 is inverted through the inverter INV3 and is output as a low level second input pad selection signal SEL_BOT. Signals SEL_TOP and SEL_BOT are distributed as gating signals to the other stages of FIG. 5, although the interconnecting lines are omitted for clarity.

The high level of first input pad selection signal SEL_TOP is inverted by the inverter INV4 and output as a low level signal, which is logically NOR'd with the high level signal of first address pad XMSB_TOP by the NOR gate 141 to output a low level signal to an input terminal of the NOR gate 143. The low level of second input pad selection signal SEL_BOT that is output through the inverter INV3 is inverted by the inverter INV5 and output as a high level signal, which is logically NOR'd with the high level signal of second address pad XMSB_BOT in the NOR gate 142 to output a low level signal to the other input terminal of the NOR gate 143. The two low level signals input into the NOR gate 143 are NOR'd to output a high level signal, which is inverted by the inverter INV6 and output as a low level signal to transmission gate 146. At this time, as a gate of a PMOS transistor of the transmission gate 146 is input with a low level of second input pad selection signal SEL_BOT and a gate of an NMOS transistor of transmission gate 146 is input with the high level of first input pad selection signal SEL_TOP, the transmission gate 146 transfers the low level signal output from the inverter INV6 to the inverter INV7. Simultaneously, as a gate of a PMOS transistor of the transmission gate 148 is input with a high level of first input pad selection signal SEL_TOP and a gate of an NMOS transistor of the transmission gate 148 is input with the low level of second input pad selection signal SEL_BOT, the transmission gate 148 is turned off and accordingly cannot transfer the high level signal output from the NOR gate 143 to the inverter INV7.

Thus, the low level signal output from the transmission gate 146 is inverted through the inverter INV7 and outputs a chip selection signal CS_MSB of a high level, which is input to the control circuit 104. The control circuit 104 receives and logically operates the high level first input pad selection signal SEL_TOP and the low level second input pad selection signal SEL_BOT to output either the first semiconductor chip selection signal CS_TOP or the second semiconductor chip selection signal CS_BOT to the input circuit 106.

The operation of outputting the first semiconductor chip selection signal CS_TOP or the second semiconductor chip selection signal CS_BOT in the control circuit 104 will now be explained with reference to FIG. 6.

The chip enable signal XCS_TOP of the first semiconductor chip 20 and the chip enable signal XCS_BOT of the second semiconductor chip 22 are signals for controlling whether to selectively operate one or both of the first and second semiconductor chips 20, 22, respectively.

When the chip enable signal XCS_TOP of the first semiconductor chip 20 is high and the chip enable signal XCS_BOT of the second semiconductor chip 22 is low, the NAND gate 150 NANDs the high level of the first input pad selection signal SEL_TOP with the high level of the chip enable signal XCS_TOP of the first semiconductor chip 20 to thereby output a low level signal to NAND gate 154. NAND gate 152 NANDs the low level of the second input pad selection signal SEL_BOT and the low level of the chip enable signal XCS_BOT of the second semiconductor chip 22, to thereby output a high level signal to the other input of the NAND gate 154. NAND gate 154 NANDs the low level signal output from the NAND gate 150 and the high level signal output from the NAND gate 152 to thereby output a high level signal to triple-input NAND gates 156 and 158. Triple-input NAND gate 156 NANDs the high level signal output from the NAND gate 154, the high level of the first input pad selection signal SEL_TOP and the high level of the chip selection signal CS_MSB to thereby output a low level signal. Triple-input NAND gate 158 NANDs the high level signal output from the NAND gate 154, the low level of the second input pad selection signal SEL_BOT and the high level of the chip selection signal CS_MSB output from the inverter INV7 to thereby output a high level signal. The low level signal output from the triple-input NAND gate 156 is inverted by the inverter 160 and output as a high level of the first semiconductor chip selection signal CS_TOP. The high level signal output from the triple-input NAND gate 158 is inverted by the inverter 162 and output as a low level of the second semiconductor chip selection signal CS_BOT. Accordingly, when the first semiconductor chip selection signal CS_TOP is a high level signal and the second semiconductor chip selection signal CS_BOT is a low level signal, the first semiconductor chip 20 is activated and the second semiconductor chip 22 enters a standby state.

Alternatively, to operate the second semiconductor chip 22, a low level signal is input to the first address pad XMSB_TOP and a low level signal is input to the second address pad XMSB_BOT. The second bonding option pad XBOT of the second semiconductor chip 22 is connected to Vcc and the first bonding option pad XTOP is not connected to Vcc, nor electrically connected to Vss. At this time, the first chip selection circuit 102 outputs to the control circuit 104 a low level signal that is input through the first bonding option pad XTOP, a second semiconductor chip enable signal XCS_BOT and a first semiconductor chip disable signal that are input through the second address pad XMSB_BOT.

Then, when the first address pad XMSB_TOP is input with a low level signal and the second address pad XMSB_BOT is input with a low level signal, the second bonding option pad XBOT of the first semiconductor chip 20 is connected to Vcc, the first bonding option pad XTOP of the first semiconductor chip 20 is input with a low level signal or no signal because the first bonding option pad XTOP is in a floating state, and the second bonding option pad XBOT is input with a high level signal. In this case, the NMOS transistor N1 is turned on and the NMOS transistor N2 is turned off. When the NMOS transistor N1 is turned on, the first bonding option pad XTOP is connected to a ground terminal and accordingly enters a low level state, and the low level signal of the first bonding option pad XTOP is output as a low level of the first input pad selection signal SEL_TOP through the inverters INV1, INV2, and is again inverted through the inverter INV3 and output as a high level of the second input pad selection signal SEL_BOT.

The low level of the first input pad selection signal SEL_TOP is inverted by the inverter INV4 and output as a high level signal. At this time, the NOR gate 141 NOR's the low level of the first address pad XMSB_TOP with the high level signal output through the inverter INV4, thereby outputting a low level signal to an input terminal of the NOR gate 143. The high level of the second input pad selection signal SEL_BOT is inverted by the inverter INV5 and output as a low level signal. At this time, the NOR gate 142 NOR's the low level of the second address pad XMSB_BOT with the low level signal at the output of the inverter INV5, to thereby output a high level signal to another input terminal of the NOR gate 143.

The NOR gate 143 NOR's the low level signal output from the NOR gate 141 with the high level signal output from the NOR gate 142, to thereby output a low level signal. The low level signal output from the NOR gate 143 is inverted by the inverter INV6 and output as a high level signal to transmission gate 146. At this time, since a gate of the PMOS transistor of the transmission gate 146 is input with a high level of second input pad selection signal SEL_BOT and a gate of the NMOS transistor of transmission gate 146 is input with the low level of the first input pad selection signal SEL_TOP, the transmission gate 146 is turned off and accordingly cannot transfer the high level signal output by inverter INV6 to the inverter INV7. Simultaneously, since a gate of the PMOS transistor of the transmission gate 148 is input with the low level of first input pad selection signal SEL_TOP and a gate of the NMOS transistor of the transmission gate 148 is input with the high level of second input pad selection signal SEL_BOT, the transmission gate 148 is turned on and transfers the low level signal output from the NOR gate 143 to the inverter INV7. Thus, the low level signal output through the transmission gate 148 is inverted by the inverter INV7 and output as a chip selection signal CS_MSB of a high level.

The control circuit 104 receives and logically operates the low level of the first input pad selection signal SEL_TOP and the high level of the second input pad selection signal SEL_BOT to output either the first semiconductor chip selection signal CS_TOP or the second semiconductor chip selection signal CS_BOT to the input circuit 106.

When the chip enable signal XCS_TOP of the first semiconductor chip 20 is low and the chip enable signal XCS_BOT of the second semiconductor chip 22 is high, the NAND gate 150 NANDs the low level of the first input pad selection signal SEL_TOP with the low level of the chip enable signal XCS_TOP of the first semiconductor chip 20 to output a high level signal to NAND gate 154. NAND gate 152 NANDs the high level of the second input pad selection signal SEL_BOT and the high level of the chip enable signal XCS_BOT of the second semiconductor chip 22 to thereby output a low level signal to the NAND gate 154. NAND gate 154 NANDs the high level signal output from NAND gate 150 and the low level signal output from the NAND gate 152 to thereby output a high level signal to triple-input NAND gates 156 and 158. Triple-input NAND gate 156 NANDs the high level signal output from the NAND gate 154, the low level of the first input pad selection signal SEL_TOP and the high level of the chip selection signal CS_MSB to thereby output a high level signal. Triple-input NAND gate 158 NANDs the high level signal output from the NAND gate 154, the high level of second input pad selection signal SEL_BOT and the high level of the chip selection signal CS_MSB to thereby output a low level signal. The high level signal output from the triple-input NAND gate 156 is inverted through the inverter 160 and output as the first semiconductor chip selection signal CS_TOP of a low level. The low level signal output from the triple-input NAND gate 158 is inverted through the inverter 162 and output as the second semiconductor chip selection signal CS_BOT of a high level. Accordingly, when the first semiconductor chip selection signal CS_TOP is a low level signal and the second semiconductor chip selection signal CS_BOT is a high level signal, the first semiconductor chip 20 is at a standby state and the second semiconductor chip 22 is activated.

In FIG. 6, however, if the chip enable signal XCS_TOP of the first semiconductor chip 20 is low and the chip enable signal XCS_BOT of the second semiconductor chip 22 is high when the first input pad selection signal SEL_TOP is high and the second input pad selection signal SEL_BOT is low, or if the chip enable signal XCS_TOP of the first semiconductor chip 20 is high and the chip enable signal XCS_BOT of the second semiconductor chip 22 is low when the first input pad selection signal SEL_TOP is low and the second input pad selection signal SEL_BOT is high, both the first and second semiconductor chips 20, 22, respectively, are in the standby state.

The input circuit 106 receives the first semiconductor chip enable signal CS_TOP and the second semiconductor chip enable signal CS_BOT to output a decoder enable signal in response to signals input from pads of the first and second semiconductor chips 20, 22, respectively, thereby allowing the data write driver 112 to write data that is input through input/output buffers of the I/O circuit 110 to the cell array 114. At this time, in FIG. 7, if the first semiconductor chip 20 is at an active state, the first semiconductor chip enable signal CS_TOP enters a high level and the NAND gate 170 outputs the inverse of a signal input from a predetermined pad of the first semiconductor chip 20. In addition, the NAND gate 172 is input with the second semiconductor chip enable signal CS_BOT of a low level and therefore outputs a high level signal. Accordingly, the NAND gate 174 outputs to the decoding circuit 108 the inverse of signals output from the NAND gate 170, which are the signals input to the NAND gate 170 from the predetermined pad of the first semiconductor chip 20.

In contrast, if the second semiconductor chip 22 is at an active state, the second semiconductor chip enable signal CS_BOT enters a high level and the NAND gate 172 outputs the inverse of a signal input from a predetermined pad of the second semiconductor chip 22. In addition, the NAND gate 170 is input with the second semiconductor chip enable signal CS_TOP of a low level and therefore outputs a high level signal. Accordingly, the NAND gate 174 outputs to the decoding circuit 108 the inverse of signals output from the NAND gate 172, which are the signals input to the NAND gate 172 from the pads of the second semiconductor chip 22.

As described above, when two identical chips are packaged into a semiconductor device, the interface is determined by the bonding option, thereby preventing interface conflicts. Because the two chips are mounted and bonded to the same set of interface contact pads, the package density and contact capacitance are doubled without increasing the number of pads used or the size of the chip.

Preferred embodiments of the present invention have been disclosed herein and, although specific terms are employed, they are used in a generic and descriptive sense only and not for the purpose of limitation. Accordingly, it will be understood by those of ordinary skill in the art that various changes in form and details may be made without departing from the spirit and scope of the invention as set forth in the following claims.

What is claimed is:

1. A flip chip interface circuit of a semiconductor memory device for combining a first semiconductor chip and a second semiconductor chip which are identical to each other into one flip chip package, comprising:

a chip selection circuit for outputting first and second input pad selection signals and a chip select signal in response to signals input from first and second address pads and first and second bonding option pads that are provided in each of the two identical chips; and a control circuit for outputting first and second semiconductor chip selection signals in response to an input of the chip select signal and an input pad selection signal output from the chip selection circuit, and for controlling input/output of the first semiconductor chip and the second semiconductor chip.

2. The flip chip interface circuit as claimed in claim 1, wherein the chip selection circuit comprises:

an input pad selector for receiving a signal input from the first bonding option pad and the second bonding option pad to output first and second input pad selection signals; and a chip selector for performing a logic operation on the first and second input pad selection signals output from the input pad selector and signals input from the first and second address pads to output a chip selection signal.

3. The flip chip interface circuit as claimed in claim 2, wherein the input pad selector comprises:

a first inverter for inverting data of a first bonding option pad in response to a bonding data of the second bonding option pad;

a second inverter for inverting data of a second bonding option pad in response to a bonding data of the first bonding option pad;

a first input pad selector for outputting a first input pad selection signal when the bonding data of the first bonding option pad is at an active state; and a second input pad selector for outputting a second input pad selection signal when the bonding data of the second bonding option pad is at an active state.

4. The flip chip interface circuit as claimed in claim 3, wherein the first inverter is an NMOS transistor.

5. The flip chip interface circuit as claimed in claim 4, wherein the second inverter is an NMOS transistor.

6. The flip chip interface circuit as claimed in claim 5, wherein the first input pad selector comprises two inverters connected in series.

7. The flip chip interface circuit as claimed in claim 6, wherein the second input pad selector comprises three inverters connected in series.

8. The flip chip interface circuit as claimed in claim 1, wherein the first and second address pads are input with additional addresses and select an active mode or a standby mode of the first and second semiconductor chips in response to the additional address input voltage.

9. A flip chip interface circuit of a semiconductor memory device for interfacing with a flip chip package, the flip chip package includes:

a first semiconductor chip provided on an upper side of an assembling lead frame having first and second address pads, first and second bonding option pads, and various pads formed thereon; and a second semiconductor chip provided under the assembling lead frame wherein the first and second address pads, first and second bonding option pads, and various pads that are formed on the first semiconductor chip are also symmetrically arranged on the second semiconductor chip in a mirror type arrangement relative to the first semiconductor chip, wherein the first and second address pads are input with a signal for selecting operations of the first and second semiconductor chips, the first bonding option pad of the first semiconductor chip is connected to Vcc, the second bonding option pad of the first semiconductor chip is not connected to ground nor electrically connected, the second bonding option pad of the second semiconductor chip is connected to Vcc, and the first bonding option pad of the second semiconductor chip is not connected to ground nor electrically connected, the flip chip interface circuit comprising:

a chip selection circuit for outputting first and second input pad selection signals and first and second semiconductor chip selection signals in response to signals input from the first and second address pads and the first and second bonding option pads;

a control circuit for controlling input/output of the first and second semiconductor chips in response to inputs of the first and second semiconductor chip selection signals and the first and second input pad selection signals output from the chip selection circuit; and an input circuit for transmitting data input from a plurality of pads formed in the first and second semiconductor chips to the first and second semiconductor chips in response to first and second semiconductor chip selection input control signals of the control circuit.

10. The flip chip interface circuit as claimed in claim 9, wherein the first and second address pads are input with additional addresses and select an active mode or a standby mode of the first and second semiconductor chips in response to an input voltage of the additional addresses.

11. The flip chip interface circuit as claimed in claim 9, wherein the chip selection circuit comprises:

an input pad selector for receiving a signal input from the first bonding option pad and the second bonding option pad to output first and second input pad selection signals; and a chip selector for performing a logic operation on the first and second input pad selection signals output from the input pad selector and signals input from the first and second address pad to output a chip selection signal.

12. The flip chip interface circuit as claimed in claim 11, wherein the input pad selector comprises:

a first inverter for inverting data of a first bonding option pad in response to a bonding data of the second bonding option pad;

a second inverter for inverting data of a second bonding option pad in response to a bonding data of the first bonding option pad;

a first input pad selector for outputting a first input pad selection signal when the bonding data of the first bonding option pad is at an active state; and a second input pad selector for outputting a second input pad selection signal when the bonding data of the second bonding option pad is at an active state.

13. The flip chip interface circuit as claimed in claim 12, wherein the first inverter is an NMOS transistor.

14. The flip chip interface circuit as claimed in claim 12, wherein the second inverter is an NMOS transistor.

15. The flip chip interface circuit as claimed in claim 12, wherein the first input pad selector comprises two inverters connected in series.

16. The flip chip interface circuit as claimed in claim 12, wherein the second input pad selector comprises three inverters connected in series.

17. The flip chip interface circuit as claimed in claim 9, wherein the chip selection circuit comprises:

a first NMOS transistor with its source grounded, its drain connected to a first bonding option pad and its gate connected to a second bonding option pad;

a second NMOS transistor with its source grounded, its drain connected to the second bonding option pad and its gate connected to the first bonding option pad; and first, second and third inverters connected in series to the first bonding option pad, wherein an output terminal of the second inverter outputs a first input pad selection signal and an output terminal of the third inverter outputs a second input pad selection signal.

* * * * *